United States Patent [19]

Huang et al.

[11] Patent Number: 5,198,881
[45] Date of Patent: Mar. 30, 1993

[54] BARRIER LAYER DEVICE PROCESSING

[75] Inventors: Jammy C. Huang, Andover; Mordechai Rothschild, Newton; Barry E. Burke; Daniel J. Ehrlich, both of Lexington; Bernard B. Kosicki, Acton, all of Mass.

[73] Assignee: Massachusetts Institute of Technology, Cambridge, Mass.

[21] Appl. No.: 742,274

[22] Filed: Aug. 7, 1991

Related U.S. Application Data

[63] Continuation of Ser. No. 458,250, Dec. 28, 1989, abandoned.

[51] Int. Cl.[5] .................. H01L 29/78; H01L 27/14; H01L 31/00
[52] U.S. Cl. .................. 257/219; 257/222; 257/440; 257/436; 257/447; 257/460; 257/464; 257/463; 257/655
[58] Field of Search ............... 357/24 LR, 30, 88, 89, 357/91

[56] References Cited

U.S. PATENT DOCUMENTS

| | | | |
|---|---|---|---|
| 4,229,754 | 10/1980 | French | 357/24 |
| 4,247,862 | 1/1981 | Klein | 357/24 |
| 4,276,099 | 6/1981 | Keen et al. | 357/30 |
| 4,321,747 | 3/1982 | Takemura et al. | 357/24 |
| 4,340,617 | 7/1982 | Deutsch et al. | |
| 4,365,259 | 12/1982 | Schroder | 357/30 |
| 4,454,526 | 6/1984 | Nishizawa et al. | 357/30 |
| 4,522,657 | 12/1985 | Rohatgi et al. | 357/30 |
| 4,616,247 | 10/1986 | Chang et al. | 357/30 |
| 4,670,063 | 6/1987 | Schachameyer et al. | |
| 4,718,974 | 1/1988 | Minaee | |
| 4,752,668 | 6/1988 | Rosenfield et al. | |
| 4,760,031 | 7/1988 | Janesick | 357/24 |
| 4,885,620 | 12/1989 | Kemmer et al. | 357/24 X |
| 5,051,802 | 9/1991 | Prost et al. | 357/30 |

OTHER PUBLICATIONS

S. Isomae, S. Aoki and K. Watanabe, "Depth profile of interstitial oxygen in silicon subjected to three-step annealing." *J. Appl. Phys.* 55. 817 (1984) pp. 817-823.

H. Muraoka, T. Ohhashi and Y. Sumitomo, "Controlled Preferential Etching Technology." in *Semiconductor Silicon 1973*. Edited by H. R. Huff and R. R. Gurgess (The Electrochemical Society Inc., Princeton, New Jersey. 1973) pp. 327-338.

"Solubility Limits of Dopants in Laser-Treated Silicon"—E. Fogarassy, et al. Laser and Electron Beam Processing of Materials, Academic Press, 1980 pp. 117-123.

*Primary Examiner*—J. Carroll
*Attorney, Agent, or Firm*—Thomas J. Engellenner; Michael I. Falkoff

[57] ABSTRACT

A surface electron barrier region is formed on a semiconductor membrane device by a single step laser process which produces a sharp doping profile in a surface region above the light penetration depth. Enhanced quantum efficiency is observed, and by selectively forming barrier layers of differing depth, a CCD device architecture for two-color sensitivity is achieved. The barrier layer results in enhanced membrane-type and radiation hardened bipolar and CMOS devices.

12 Claims, 4 Drawing Sheets

BARRIER LAYER DEVICE PROCESSING

The U.S. government has rights in this invention pursuant to U.S. Air Force Contract No. F 19628-85-C-0002.

This application is a continuation of application Ser. No. 07/458,250, filed Dec. 28, 1989, abandoned.

BACKGROUND OF THE INVENTION

The present invention relates to semiconductor devices, and particular to semiconductor CCDs, arrays which convert a light field to a spatially resolved discrete electronic charge distribution. In such devices, light striking a semiconductor substrate dislodges electrons resulting in a localized charge region. A gate structure is fabricated adjacent the region, and is operated to periodically sample the accumulated charge. The semiconductor substrate limits the mobility of the dislodged electrons so that the charge distribution gated out of the substrate faithfully reflects the distribution of photons striking the device. A typical device may include an array of several hundred pixels in each direction.

In order to achieve greater light sensitivity in such devices, it is desirable that the device be formed on a very thin semiconductor substrate, i.e., a membrane, and that the illumination field strike the device from the opposite side of the substrate than that on which the gate array structure is fabricated. In devices of this type the light is directed at the back surface of the membrane, and the electrons freed by light in each region must travel to a gate of the array fabricated on the front surface of the membrane.

One factor which impairs the efficiency of such devices is that surface interactions are possible which may allow those freed electrons residing at, or passing near, the back surface to recombine with holes. This effect causes a drop in the detected charge level. Thus it is desirable to prevent electrons dislodged by incoming photons near the rear surface from reaching that surface. In a sensor intended for sensing ultraviolet radiation, for which the absorption coefficient is large and substantially all electron-photon interactions occur in a shallow depth of well under a micron at the rear surface, this effect is particularly pronounced.

SUMMARY OF THE INVENTION

Accordingly, it is an object of the invention to provide a surface barrier layer of improved characteristics.

It is a further object of the invention to provide an improved surface barrier layer at one surface of a semiconductor membrane which enhances the collection of electrons at the opposite surface of the membrane.

It is a further object of the invention to provide a CCD of improved quantum efficiency.

These and other features of the invention are achieved in a CCD and a method of fabrication wherein an array of charge gate structures are formed on the front surface of a substrate which is thinned to a membrane thickness and mounted on a support, and the rear surface of the membrane is then doped and annealed in a single step to a depth less than the light penetration depth. The doping and annealing are performed by application of a discrete number of pulses of laser illumination in a gaseous atmosphere. An extremely shallow but heavily doped barrier layer with square dopant profile is thus formed with a sharply defined boundary lying well above the penetration depth of incident radiation. This barrier layer provides enhanced quantum efficiency of the device, resulting in particularly great improvements in electron collection when used to detect illumination in the ultraviolet.

BRIEF DESCRIPTION OF DRAWINGS

These and other features of the invention will be understood with reference to the drawings, illustrating details of fabrication of a representative device and the processing steps in such fabrication, wherein.

DETAILED DESCRIPTION OF THE INVENTION

Figure 1:
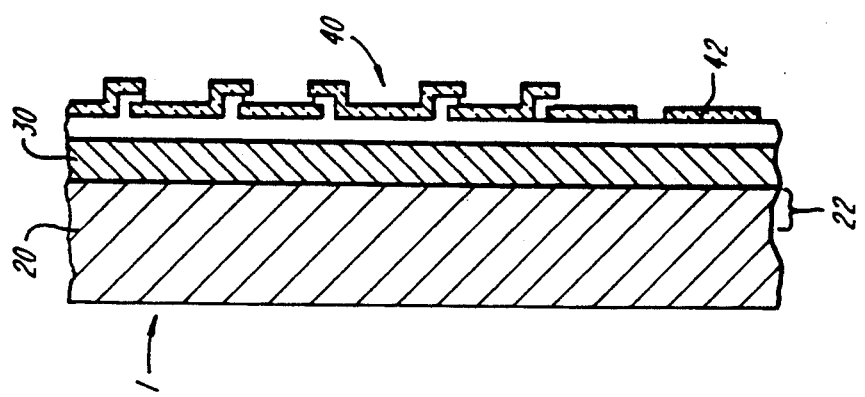
FIG. 1 shows elements of a representative semiconductor wafer at an early fabrication stage.

FIG. 1 shows a portion of a wafer 1 in an early fabrication state, illustrated to better show process steps involved in the practice of a preferred embodiment of the invention. Wafer 1 is formed of a commercially-available heavily p+ doped three inch wafer blank of 400 micron thickness, having a resistivity of approximately 0.12 ohm-cm, of which the untreated bulk substrate 20 is shown in partial thickness. During initial processing stages of a generally known character, a lightly doped p− epitaxial layer 30 having a resistivity of approximately 30 ohm-cm has been grown on the wafer to a depth of approximately ten microns. On this epitaxial layer, an array of gate structures denoted generally by 40 is fabricated. The thicknesses shown in the drawing are not scaled, and it will be understood that that bulk substrate layer 20 is substantially thicker than shown, relative to the other layers and structures. Prior to growth of the epitaxial layer 30, a denuded-zone process is used to drive out all the oxygen from the front surface layer of the wafer, so that the portion 22 of layer 20 immediately adjacent to layer 30 constitutes an oxygen-free denuded zone, extending approximately ten to fifty microns into the wafer. A suitable process for driving off oxygen is described, for example, in the article of S. Isomae et al. "Depth profile of interstitial oxygen in silicon subjected to three-step annealing", J. Appl. Phys. 55 817 (1984).

Figure 2B:
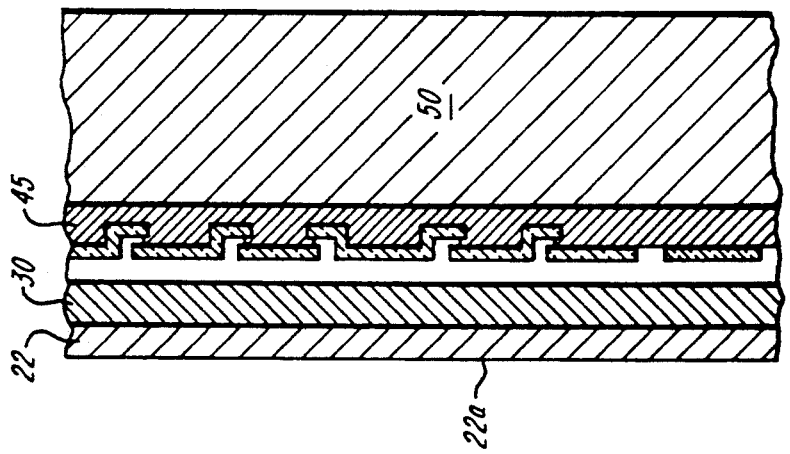
FIGS. 2A, 2B show the wafer of FIG. 1 mounted on a support and thinned to an intermediate thickness.
Figure 2A:
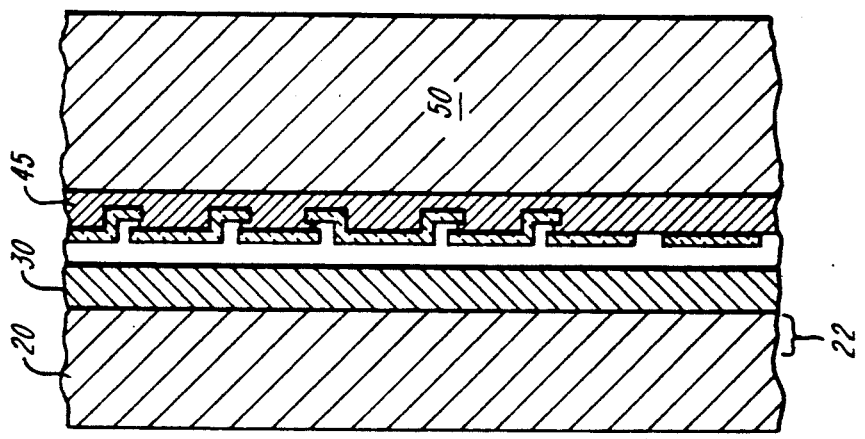

After fabrication of the gate array structure 40 and of certain ancillary elements of known type, such as a plurality of wire-contact aluminum pads of which one is illustrated at 42, the partially-completed device is bonded by an adhesive 45, such as an epoxy, to a glass support 50, as illustrated in FIG. 2A. Support 50 provides structural strength for the unit for the further processing steps and for the completed device. However, the materials and geometry of the support impose constraints on the subsequent processing environment, and in particular limit the maximum permissible processing temperature.

As shown in FIG. 2B, the bulk substrate 20 is next mechanically thinned to within the denuded zone 22 by conventional means and polished to achieve a back-side polished surface 22a which is substantially defect-free and has a flatness across the entire wafer within a ±ten micron uniformity.

Figure 3:
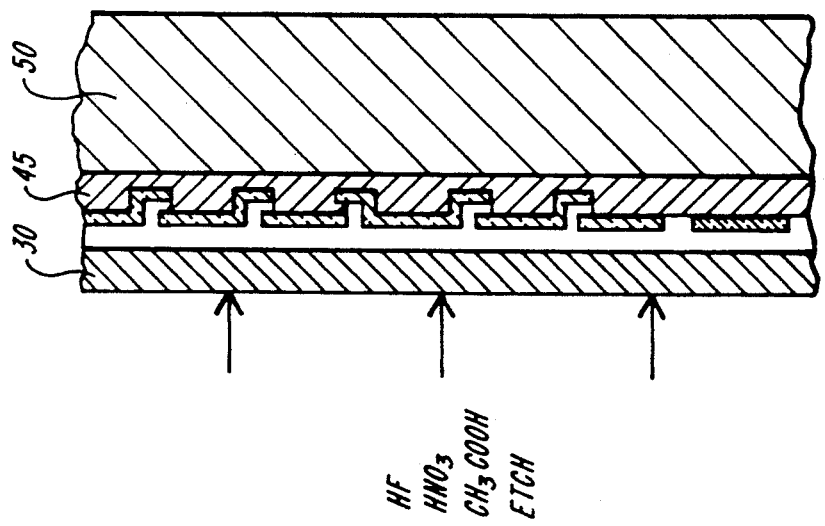
FIG. 3 shows the wafer of FIG. 2 thinned to membrane thickness.

In order to further reduce the thickness of the wafer to membrane thickness, a selective etch is then applied to remove the remaining p+ bulk substrate while stopping at the lightly doped epitaxial layer. A suitable etch is reported by H. Muraoka et al. "Controlled Preferential Etching Technology", in *Semiconductor Silicon 1973* edited by H. R. Huff and R. R. Gurgess (The Electrochemical Society Inc., Princeton, N.J. 1973) at page 327. The selective etch solution of Muraoka et al. consists of ten parts acetic acid, three parts nitric acid and one part hydrogen fluoride, with additional agents to control nitrous acid released during the etch process, and which would otherwise attack the p− epitaxial layer. Applicant has found that by providing ultrasonic agitation during the etching step, the nitrous acid is effectively removed from the etching interface without these additional agents, and an etching selectivity as high as 25:1 is obtained. In this manner, a final layer thickness uniformity of 0.4 microns is achieved after removal of the bulk substrate for the entire surface of a twelve micron thick epitaxial layer grown on a three-inch wafer of 400 micron initial thickness. FIG. 3 shows the membrane at the end of the selective etch step, with the bulk p+ material removed leaving layer 30 with its gate structures 40 as an active device of membrane thickness.

The processing as described to this point achieves a whole-wafer size semiconductor membrane of a substantially uniform thickness and substantially free of back surface defects. A number of individual CCD arrays may be fabricated on a single such wafer, with sixteen 420×420 pixel CCD's being successfully fabricated on a three inch wafer in one prototype process run. By way of scale, in other embodiments the membrane thickness may be approximately under one micron to one hundred microns thick.

Figure 4:
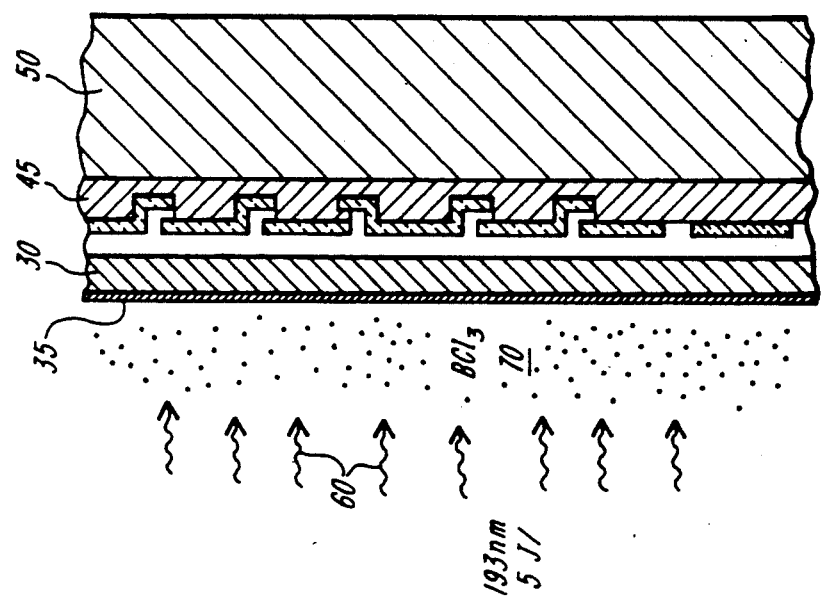
FIG. 4 shows back surface doping of the semiconductor membrane according to this invention.

According to a principal aspect of the present invention shown in FIG. 4, the epoxy-mounted membrane is then back side doped in accordance with the invention by exposure to pulsed laser radiation 60 in the presence of a gaseous medium 70 which deposits the desired impurity on the back surface when so illuminated. In accordance with this aspect of the invention, the laser radiation is selectively applied in short pulses at a high energy level, preferably of between (0.25) and (1.0) Joules per square centimeter per pulse. The impurity is diffused into the membrane to a controlled depth at a selected concentration effective to prevent electrons from reaching the surface.

In the preferred implementation for surface doping of a CCD described above, the impurity was provided by a chamber atmosphere of boron trichloride gas at 7-10 Torr pressure, and the laser pulses were provided by an excimer laser operating at 193 nm with an energy density of one half to one joule/cm$^2$/pulse. The energy density of the laser beam was such that a single pulse photolytically dissociated the boron trichloride to deposit boron on the membrane, and also caused melting of the top layer of the semiconductor membrane to a depth $E_o$ of several hundred Angstroms. The delivered pulse energy was insufficient to significantly raise the temperature of the membrane as a whole. Consequently, the epoxy mounting was not degraded, nor were the epitaxial circuit structures damaged by thermal effects such as lattice damage or diffusion from the aluminum pads 42. The depth $E_o$ was selected to be less than $1/\alpha$, where $1/\alpha$ is the characteristic absorption length for the wavelength of light which it is desired to detect, i.e., the intensity of transmitted light of that wavelength at depth x is given by $e^{-\alpha x}$.

Figure 5:
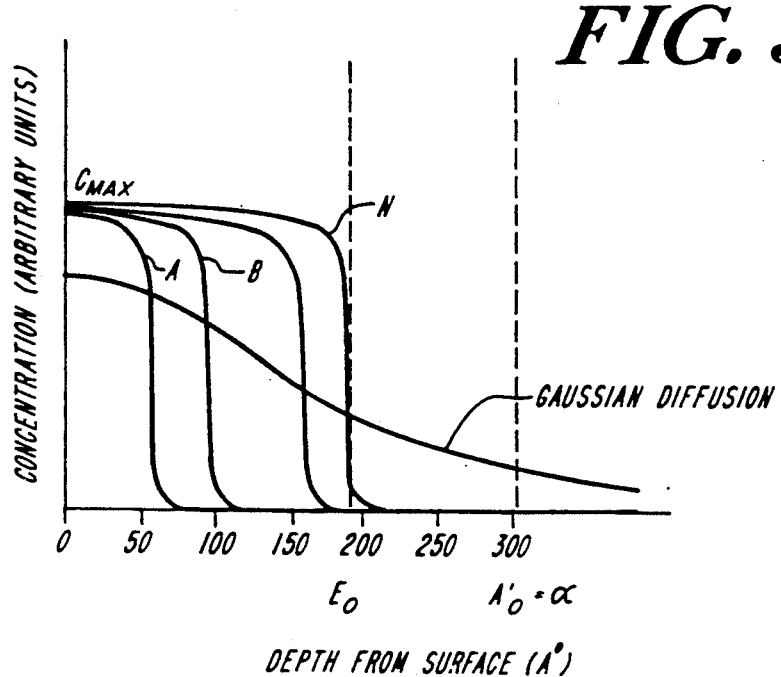
FIG. 5 illustrates doping concentration profiles achieved in accordance with the invention.

FIG. 5 shows a schematic graph of dopant concentration with depth from the back surface as a function of the number of pulses applied to membrane. On the horizontal axis, the coordinates represent the depth from the back surface, with a fixed depth $E_0$ representing the preferred thickness of the barrier layer. To achieve optimum sensitivity at a wavelength $\lambda_0$ having a characteristic absorption path length $1/\alpha = A_0$ in the semiconductor, $E_0$ is selected to be sufficiently smaller than $A_0$ such that the majority of electrons dislodged by light of wavelength $\lambda_0$ will originate below the barrier layer, and thus cannot return to the back surface where they might recombine and their charge be neutralized. Thus they are more effectively collected by the local gate structure for the corresponding pixel at the front surface. For a CCD primarily sensitive to shorter ultraviolet wavelengths, e.g., below 300 nm, a dopant layer depth $E_0$ as shallow as 100 Angstroms is desirable, while for longer UV wavelengths a surface dopant layer of approximately 500 Angstroms thickness is effective. At the other extreme, if it is desired to detect only infrared wavelength photons, a dopant layer thickness as great as 5000 Angstroms may be employed.

As shown in FIG. 5, a single twenty nanosecond laser pulse as described above produces a dopant profile as shown in curve A, wherein a surface dopant concentration of $C_{max}$ diffuses into the membrane with a substantially uniform dopant concentration throughout a diffusion path depth $M_1 < E_0$, dropping off sharply thereafter. The application of several, e.g., two or three, pulses produces a similar non-Gaussian, box-like diffusion profile, curve B, at a slightly higher and equally uniform concentration to a second depth $M_2 < E_0$, with further pulses quickly and uniformly doping the entire depth $E_0$ with the profile illustrated in curve N. Each of these curves shows a substantially uniform dopant concentration, which, as used here and in the claims, is understood to mean a dopant profile which drops abruptly to zero at a depth, so that the distribution curve lacks the characteristic "tail" of a Gaussian distribution. The concentration is not shown in absolute units, and concentrations above the steady state solubility limit of dopant in the substrate are readily achieved by this process. A practical dopant concentration for this particular application is approximately $10^{21}$ boron atoms/cc, and a regimen of seven to twelve laser pulses was found to provide an effective barrier layer that improved the quantum efficiency of a CCD membrane device by a factor of between three and ten in the UV region, with significant improvements extending well into the infrared. By way of comparison, the curve G in FIG. 5 shows a typical dopant concentration obtained by a conventional thermal diffusion process.

Figure 5A:
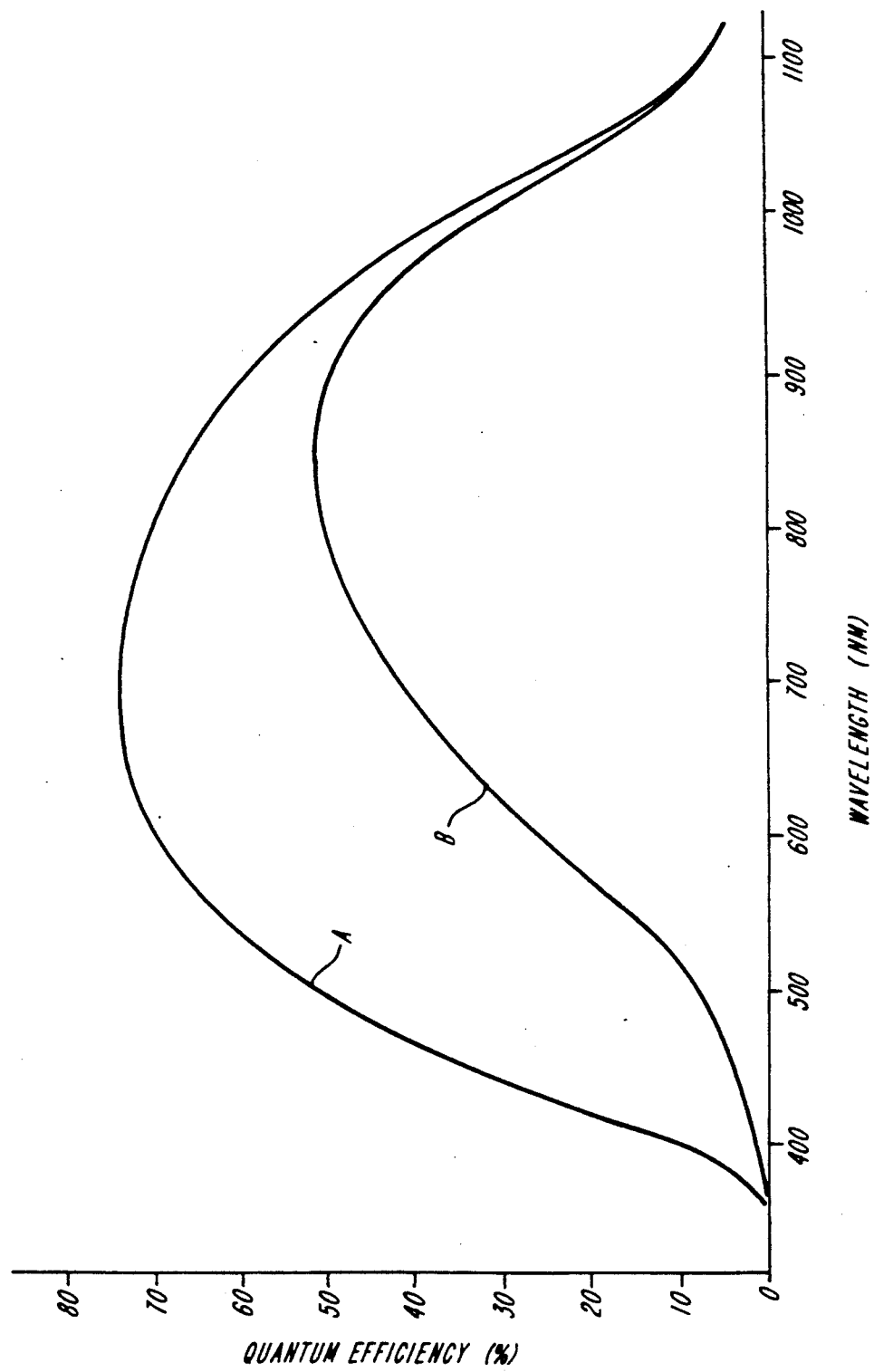
FIG. 5A shows relative quantum efficiency of a back surfaced doped semiconductor device.

FIG. 5A shows graphs of the quantum efficiency, as a function wavelength, of a membrane CCD detector having a backside doped barrier layer in accordance with the invention. The upper curve A was measured on a barrier layer device, while the lower curve B was measured for a similar membrane device of conventional construction. The response is significantly improved at all wavelengths below 900 nm, with the output increased severalfold in the 250-600 nm band.

As described above, the dopant was a boron impurity which was deposited by photolytic decomposition of the ambient gas onto the wafer surface, and was driven in and annealed by the same laser pulse as was used to effect the deposition. Other impurities such as gallium may also be deposited by this method for other applications. The class of suitable dopant materials also includes fluids which are pyrolytically decomposed by contact with the laser-illuminated wafer surface, rather than photolytically broken down. Suitable illumination sources, in addition to the above described 193 nm excimer laser, include other lasers capable of similarly short duration high energy pulsed operation. For example a Neodymium doped solid state laser operated in a mode-locked configuration to produce pulses as short as several hundred picoseconds, and frequency-shifted to the UV, may provide a focused pulse energy effective for forming dopant layers of fifty to one hundred Angstroms thickness.

An alternative approach to achieving the barrier layer doping of the present invention is to cool the substrate and to employ evaporation, sputtering, or a low temperature CVD process to deposit a thin solid film of dopant on the membrane surface. In a subsequent step, the deposited film is illuminated by a laser at a highly absorbed wavelength at the fluences as discussed above to drive in the dopant. The fluences and total doses may be modified to account for the change in reflectivity, as would be understood by those skilled in the art. The foregoing techniques provide a barrier layer on a semiconductor membrane without impairing thermally, chemically, or physically sensitive structures already built on the membrane. In particular, the opposite (front) surface may have bipolar devices fabricated thereon, or the membrane may be any of a number of highly crystalline radiation-hard membrane devices.

In accordance with a further embodiment of the invention, the barrier layer technology as described above is applied to produce semiconductor light sensor arrays which have two-color sensitivity. Briefly, this is accomplished by employing patterned pulsed laser illumination to form different barrier layers, a shallow layer and a thick layer, over two interleaved pixel-defining sets of charge gating structures.

At least the thick barrier layer is formed by laser exposure through a mask, which is focused to illuminate only those areas of the membrane above one or other of the pixel arrays. The shallow layer, which may be formed without a mask on the entire membrane surface, is of a thickness, e.g., 100 Angstroms, which is thinner than the absorption length of a short wavelength, and is the only barrier formed over a first n by m array of pixels. Thus, substantially all light striking the first array is collected by its gate structure with high efficiency. A second n by m array interleaved with the first array is separately doped by pulsed laser doping as described above to a significantly deeper level, e.g., 5000 Angstroms. This is substantially thicker than the absorption length of all short wavelength light, so that virtually none of the shorter wavelength radiation striking the array penetrates the second dopant layer to create any free electron charge. The second set of pixels therefore senses exclusively longer-wavelength radiation. Thus the pixels of the first set develop a charge indicative of the total photon distribution of all wavelengths, long and short, whereas the pixels of the second set develop a signal indicative of long wavelength photons only. Further circuitry, which may be integrally fabricated with the gate structures on the front surface of the first and second arrays, may be provided to subtract the second charge signal from the first charge signal to develop a third set of charge signals indicative of the short wavelength light alone. Alternatively, such processing may be performed using external frame memories and processing circuitry.

Figure 6:
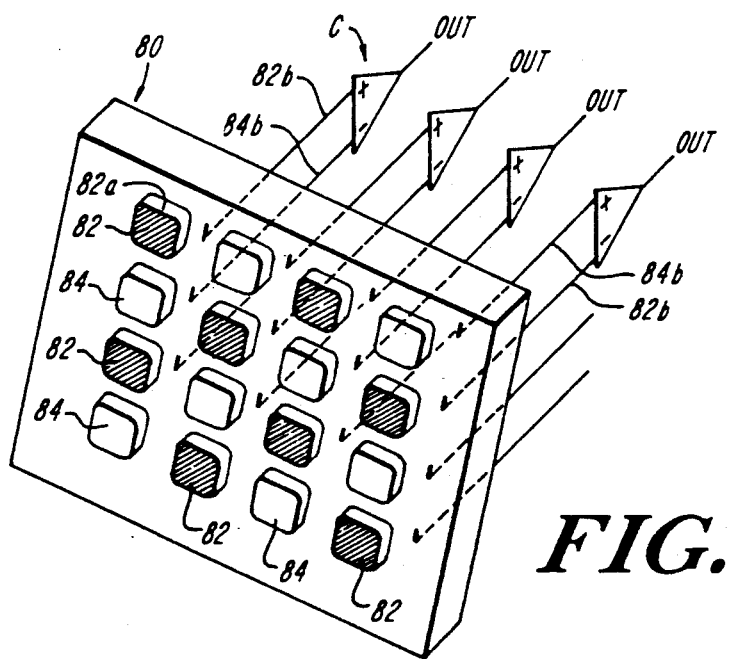
FIG. 6 illustrates a two-color CCD made in accordance with a different embodiment of the invention.

In FIG. 6, 80 indicates such a two color CCD. The first plurality of pixels 82 has a thin, square-profiled surface barrier layer, 82a, while the second plurality of pixels 84 has a thick surface barrier layer 84a. Corresponding gate outputs 82b, 84b provide the signals which locally represent the total light intensity and long wavelenth light intensity, respectively, in each region. The lines 82a, 82b may be connected to respective storage cells as output signal lines. Preferably, a further integrated differencing circuit is provided to develop a short-only signal by subtracting the charge at gate 84b from the charge at a gate of adjacent cell 82, as indicated schematically in the figure at C. Such a circuit structure may more generally include an array of local sum and difference gates connected to neighboring sensing cells of each type to develop average signals from several adjacent pixels for subtractive mixing. Alternative pixel shapes and geometries are also contemplated, such as concentric pixel arrangements or hexagonal arrays.

It will be observed that the two-color CCD architecture described above employs a single processing step of laser illumination in a controlled atmosphere, which is effected without photoresist or stripping steps, and for which a single illumination mask may be changed entirely outside the processing chamber. The different depth barrier layers not only enhance the quantum efficiency of photoelectron measurement, but simultaneously perform as spectral filters by effectively inhibiting photoelectric activity at selected wavelengths.

Figure 7:
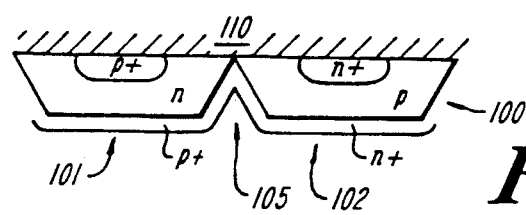
FIG. 7 illustrates a bipolar device made in accordance with another embodiment of the invention.

FIG. 7 illustrates another application of the cold-diffusion localized doping technology of the present invention. A device 100 is fabricated having one or more bipolar elements 101, 102 . . . , separated by insulating oxide trenches 105. Layer 110 indicates schematically a mounting plate, thin substrate, or other active circuit layers. Each bipolar element is characterized by a narrow p- or n-type region located between two regions of opposite type. In accordance with the present invention, the outermost doped region is formed by diffusion of a dopant into the surface of the intermediate region in an amount effective to change the type (p or n) of that layer. For a CMOS device, different dopants are applied, using different pattern masks as described for the device of FIG. 6 above, to form disjoint p+ regions and n+ regions on the rear surface of the device. In a further development, highly doped regions may be formed within less-highly doped surface regions of greater depth by a two step exposure to form channels and other circuit features.

The invention being thus disclosed by reference to a particular set of processing steps applied to a class of charge collection devices, variations and modifications within the spirit and scope of the invention will occur to those skilled in the art, and all such variations and modifications are intended to be covered by the claims appended hereto.

What is claimed is:

1. An array of semiconductor devices formed on one surface of a common substrate having membrane thickness, and a crystalline impurity layer formed by diffusion into a back surface of said substrate opposite the surface on which said array of semiconductor devices are formed, said impurity layer having a constant impurity concentration and extending only to a depth of under approximately several hundred Angstroms with negligible impurity concentration below said depth and having low electron mobility so that free electrons dislodged by light passing into the substrate cannot reach the back surface whereby charge is efficiently collected by the array of semiconductor devices.

2. An array of semiconductor devices according to claim 1, wherein said substrate has a thickness less than an electron recombination length, and said impurity layer has an impurity concentration effective to prevent back surface recombination.

3. A semiconductor device, comprising
a p-type semiconductor membrane having front and back surfaces,
an array of gate structures fabricated on the front surface of the membrane each for gating free electron charge resulting from electrons dislodged by light entering the back surface and passing into a corresponding region of said membrane,
a support member attached to said front surface for mounting and physically supporting the membrane, and
a highly-doped crystalline impurity layer diffused into the back surface of the membrane of thickness less than the penetration length of light of a wavelength $\lambda$ which is to be detected, said highly doped impurity layer having an essentially square doping profile extending from the back surface only to a depth of substantially under one thousand angstroms and said membrane having a thickness of between several micrometers and several tens of micrometers, said impurity layer presenting a sharply defining barrier layer of low electron mobility that prevents electrons dislodged in said membrane from reaching the back surface so that the free electron charge is efficiently collected by said gate structures at the front surface when the membrane is illuminated at the back surface through said barrier layer.

4. A semiconductor device according to claim 3, wherein the crystalline impurity layer has a non-Gaussian doping profile.

5. A semiconductor device comprising:
a semiconductor membrane having opposed front and back surfaces,
a first and second array of gate structures fabricated on the front surface of the membrane for gating charge from corresponding first and second arrays of pixel regions, said first and second arrays of pixel regions being interleaved,
a first electron barrier layer formed on the back surface of said membrane over said first array of pixel regions having a first thickness such that substantially no light of a first wavelength passes entirely through said first electron barrier layer, and
a second electron barrier layer formed over said back surface over said second array of pixel regions and having a second thickness less than the penetration length of light of said first wavelength, each of said first and second electron barrier layers being effective to immobilize free electrons so that any electrons dislodged by light in said membrane cannot pass through the barrier layers to recombine the back surface of the membrane whereby said first and second arrays of gate structures gate charge developed by different spectral bands of light striking said first and second arrays of pixel regions,
wherein said second barrier layer has a non-Gaussian and substantially constant dopant concentration and extends only to a depth of substantially under one thousand Angstroms, said semiconductor device constituting a two-color light-sensing array.

6. A semiconductor device according to claim 5, further comprising circuit means for differencing charges gated by said first and second arrays of gate structures.

7. A semiconductor circuit element comprising
a membrane,
an array of semiconductor devices formed on a front surface of the membrane,
a crystalline impurity layer formed by diffusion of an impurity into a back surface of the membrane,
the membrane thickness being of a dimension comparable to a characteristic electron recombination path length and said impurity being localized at said back surface in a layer extending only to a depth of substantially under one thousand Angstroms and of uniform concentration effective to prevent migration of electrons therethrough whereby free electrons cannot recombine at the back surface.

8. A semiconductor circuit element according to claim 7, wherein said circuit element is a CCD for detecting light of wavelength $\lambda$, and wherein said impurity penetrates said back surface to a depth of $E_o < 1/\alpha$, where $1/\alpha$ is the characteristic absorption length for light of wavelength $\lambda$ in said membrane.

9. A semiconductor circuit element according to claim 7, wherein a further impurity is diffused into regions of said crystalline impurity layer.

10. A semiconductor circuit element according to claim 7, wherein the element is a bipolar device.

11. A semiconductor circuit element according to claim 7, wherein the element is a CMOS element.

12. A semiconductor circuit element according to claim 7, wherein the element is a radiation-hardened element.

* * * * *